US010192812B2

(12) United States Patent
Kim et al.

(10) Patent No.: US 10,192,812 B2
(45) Date of Patent: Jan. 29, 2019

(54) POLYMER LAYER ON METAL CORE FOR PLURALITY OF BUMPS CONNECTED TO CONDUCTIVE PADS

(71) Applicant: Samsung Display Co., Ltd., Yongin-si (KR)

(72) Inventors: Byoung Yong Kim, Yongin-si (KR); Jeong Ho Hwang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/659,547

(22) Filed: Jul. 25, 2017

(65) Prior Publication Data

US 2018/0061748 A1    Mar. 1, 2018

(30) Foreign Application Priority Data

Aug. 24, 2016    (KR) .................. 10-2016-0107764

(51) Int. Cl.

| | |
|---|---|
| *H01L 23/48* | (2006.01) |
| *H01L 21/44* | (2006.01) |
| *B23K 31/02* | (2006.01) |
| *H01L 23/498* | (2006.01) |
| *H01L 23/00* | (2006.01) |
| *H01L 23/532* | (2006.01) |
| *H01L 23/31* | (2006.01) |

(52) U.S. Cl.
CPC .... *H01L 23/49811* (2013.01); *H01L 23/3171* (2013.01); *H01L 23/53204* (2013.01); *H01L 23/53209* (2013.01); *H01L 24/05* (2013.01); *H01L 24/06* (2013.01); *H01L 24/13* (2013.01); *H01L 24/81* (2013.01); *H01L 23/3192* (2013.01); *H01L 23/562* (2013.01); *H01L 2224/0401* (2013.01); *H01L 2224/05644* (2013.01); *H01L 2224/05666* (2013.01)

(58) Field of Classification Search
CPC .......... H01L 23/49811; H01L 23/3171; H01L 23/53204; H01L 24/05; H01L 24/06; H01L 24/13; H01L 24/81; H01L 23/5309
See application file for complete search history.

(56) References Cited

U.S. PATENT DOCUMENTS

| | | | |
|---|---|---|---|
| 5,508,228 A | 4/1996 | Nolan et al. | |
| 6,578,755 B1 | 6/2003 | Elenius et al. | |
| 7,282,801 B2 * | 10/2007 | Park .................. | H01L 24/11 257/737 |

(Continued)

FOREIGN PATENT DOCUMENTS

| | | |
|---|---|---|
| KR | 10-0323082 | 6/2002 |
| KR | 10-0552943 | 2/2006 |

(Continued)

*Primary Examiner* — Alonzo Chambliss
(74) *Attorney, Agent, or Firm* — H.C. Park & Associates, PLC

(57) ABSTRACT

A semiconductor chip, a display device or an electronic device includes a substrate, one or more conductive pads disposed on the substrate, and one or more bumps electrically connected to the one or more conductive pads, in which the one or more bumps includes a metal core, a polymer layer disposed over a surface of the metal core, and a conductive coating layer disposed over a surface of the polymer layer and electrically connected to the one or more conductive pads.

20 Claims, 7 Drawing Sheets

(56) References Cited

U.S. PATENT DOCUMENTS

| | | | |
|---|---|---|---|
| 7,932,600 B2 | 4/2011 | Tsang et al. | |
| 8,035,226 B1 * | 10/2011 | Wilcoxen | H01L 23/3192 |
| | | | 257/737 |
| 2009/0243093 A1 | 10/2009 | Chang | |
| 2011/0304042 A1 * | 12/2011 | Lin | H01L 24/11 |
| | | | 257/737 |
| 2014/0124925 A1 * | 5/2014 | Sidhu | B23K 35/0244 |
| | | | 257/738 |
| 2014/0319682 A1 * | 10/2014 | Sidhu | B23K 35/0244 |
| | | | 257/738 |

FOREIGN PATENT DOCUMENTS

| | | |
|---|---|---|
| KR | 10-1381644 | 2/2006 |
| KR | 10-1037744 | 5/2011 |
| KR | 10-2013-0126171 | 11/2013 |

\* cited by examiner

POLYMER LAYER ON METAL CORE FOR PLURALITY OF BUMPS CONNECTED TO CONDUCTIVE PADS

CROSS-REFERENCE TO RELATED APPLICATION

This application claims priority from and the benefit of Korean Patent Application No. 10-2016-0107764, filed on Aug. 24, 2016, which is hereby incorporated by reference for all purposes as if fully set forth herein.

BACKGROUND

Field

The invention relates generally to semiconductor chips, display panels, and electronic devices having connection terminals, and more particularly, to semiconductor chips, display panels and electronic devices in which a composite metal-polymer structure may be used as a connection terminal to provide a highly reliable connection structure and/or stabilize connections.

Discussion of the Background

Recently, according to demand for high performance and integration of electronic devices, the number of connection terminals provided in a semiconductor chip has rapidly increased. Accordingly, the size of each of the connection terminals of semiconductor chips and the pitch between connection terminals have rapidly decreased. For example, in a case of a driver Integrated Circuit (IC) mounted in a display panel, it is typically required that the pitch between connection terminals be designed to a fine level, such as 10 μm to 15 μm or less.

When a semiconductor chip in which fine pitch is required is mounted in an electronic device, such as a display panel, using an adhesive, such as an anisotropic conductive film (ACF), the probability of a short-circuit defect or an open failure is increased. For example, conductive particles included inside an ACF densely arranged in lateral surfaces of certain adjacent connection terminals provided in the semiconductor chip may cause a short-circuit defect between the adjacent connection terminals, or if conductive particles of an ACF are not appropriately disposed at positions corresponding to at least some of the connection terminals having a micro size, they may cause an open failure.

The above information disclosed in this Background section is only for enhancement of understanding of the background of the inventive concepts, and, therefore, it may contain information that does not form the prior art that is already known in this country to a person of ordinary skill in the art.

SUMMARY

Semiconductor chips, display panels, and electronic devices constructed according to the principles of the invention overcome one or more of the above-noted drawbacks or disadvantages by providing a highly reliable connection structures that stabilize connections between electrical components, such as semiconductor chips, display panels or electronic devices.

Additional aspects will be set forth in the detailed description which follows, and, in part, will be apparent from the disclosure, or may be learned by practice of the inventive concepts.

According to one aspect of the invention, a semiconductor chip includes a substrate, one or more conductive pads disposed on the substrate, and one or more bumps electrically connected to the one or more conductive pads. The one or more bumps include a metal core, a polymer layer disposed over a surface of the metal core, and a conductive coating layer disposed over a surface of the polymer layer and electrically connected to the one or more conductive pads.

The polymer layer may have a thickness of 1 μm to 7 μm.

The polymer layer may be directly adjacent to and may cover the surface of the metal core.

The conductive coating layer may be directly adjacent to and may cover the surface of the polymer.

The metal core may include a convex surface, and the polymer layer may cover the convex surface of the metal core.

The polymer layer may include a convex surface, and the conductive coating layer may cover the convex surface of the polymer layer.

The conductive coating layer may include one or more metal layers.

The semiconductor chip may further include an insulating layer disposed over the one or more conductive pads, and exposing at least one area of the one or more conductive pads.

The one or more bumps may contact the at least one exposed area.

The one or more bumps may be disposed on the one or more conductive pads, and may have a convex shape selected from the group consisting of a dome shape or a hemisphere shape, with the convex shape extending in a direction away from the substrate.

According to another aspect of the invention, a display panel includes a substrate, a plurality of connection pads disposed in a first area of the substrate, and a plurality of protruding pads electrically connected to the plurality of connection pads, respectively. At least some of the plurality of protruding pads include a metal core, a polymer layer covering a surface of the metal core, and a conductive coating layer covering a surface of the polymer layer.

At least some of the metal cores may have a convex surface extending away from the substrate and may be disposed on one surface of one of the plurality of connection pads, and wherein the polymer layer may cover the convex surface of the at least some metal cores.

The polymer layer may include a convex surface, and the conductive coating layer may cover the convex surface of the polymer layer.

The polymer layer may have a thickness of 1 μm to 7 μm.

According to another aspect of the invention, an electronic device includes a substrate including a plurality of connection pads, a semiconductor chip mounted on the substrate and having a plurality of conductive pads, the plurality of conductive pads facing the plurality of connection pads, respectively, and a plurality of bump structures disposed between the plurality of connection pads and the plurality of conductive pads, and the plurality of bump structures electrically connecting the plurality of connection pads to the plurality of conductive pads. At least some of the plurality of bump structures include a metal core, a polymer layer covering a surface of the metal core, and a conductive coating layer covering a surface of the polymer layer.

The polymer layer may have a thickness of 1 μm to 7 μm.

The metal core may include a convex surface, and the polymer layer may cover the convex surface of the metal core.

The polymer layer may include a convex surface, and the conductive coating layer may cover the convex surface of the polymer layer.

The electronic device may further include a non-conductive adhesive layer disposed between the substrate and the semiconductor chip.

The electronic device may further include a display panel including the substrate.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

Figure 1:
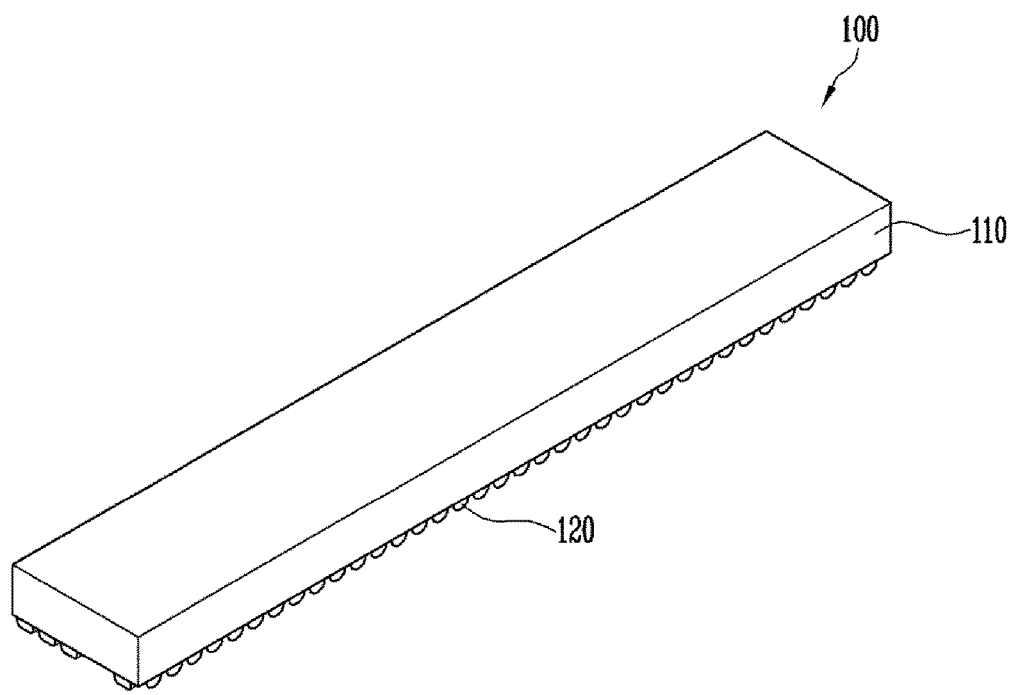
FIG. 1 is a perspective view of an embodiment of a semiconductor chip constructed according to the principles of the invention.

DETAILED DESCRIPTION OF THE
ILLUSTRATED EMBODIMENTS

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
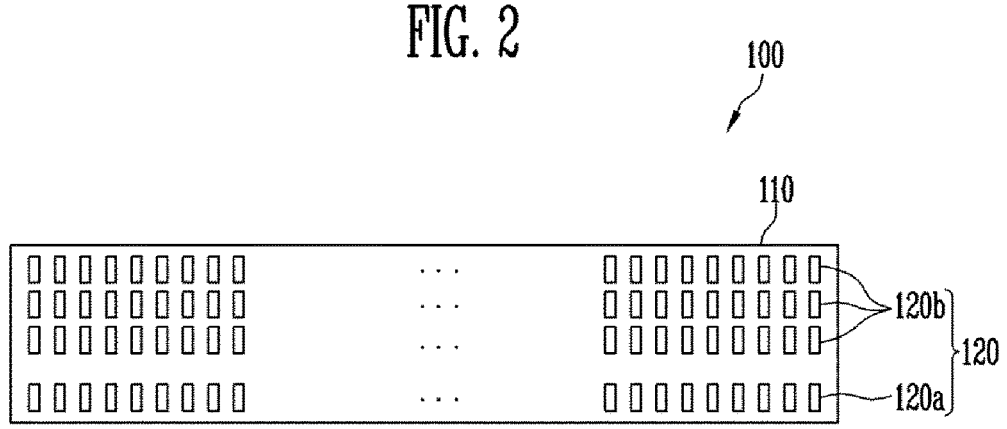
FIG. 2 is a plan view of one surface of a semiconductor chip illustrating a plurality of connection terminals constructed according to the principles of the invention.

FIG. 1 is a perspective view of an embodiment of a semiconductor chip constructed according to the principles of the invention. FIG. 2 is a plan view of one surface of a semiconductor chip illustrating a plurality of connection terminals constructed according to the principles of the invention. For example, FIG. 2 illustrates one surface of a semiconductor chip, on which one or more connection terminals are provided.

Referring to FIGS. 1 and 2, a semiconductor chip 100 according to an exemplary embodiment includes a substrate 110, and one or more connection terminals 120 provided on at least one surface of the substrate 110. The semiconductor chip 100 may include a plurality of connection terminals 120 arranged on the same surface (for example, a lower surface) with a predetermined pitch.

The substrate 110 may be a silicon wafer. However, the substrate 110 is not limited thereto, and a material and/or a shape of the substrate 110 may be changed. Various circuit devices (not illustrated) may be formed or provided on the substrate 110. The connection terminals 120 for electrically connecting the circuit devices to an electronic device (for example, a display panel) may be formed or provided on at least one surface of the substrate 110.

Each of the connection terminals 120 may include a conductive pad and a bump electrically connected to the conductive pad. The connection terminals 120 may include input/output terminals for transmitting input/output signals of the semiconductor chip 100. For example, the semiconductor chip 100 may include a plurality of input terminals 120a and a plurality of output terminals 120b arranged in at least one row. The input terminals 120a may be arranged while being spaced apart from the output terminals 120b by a predetermined distance or more.

For convenience of description, FIG. 2 illustrates the connection terminals 120 are regularly arranged on one surface of the semiconductor chip 100 in a horizontal direction and a vertical direction, but the inventive concepts are not limited thereto. That is, the sizes, the number, the pitches, and/or the arrangement structure of the connection terminals 120 may be variously changed.

Figure 3:
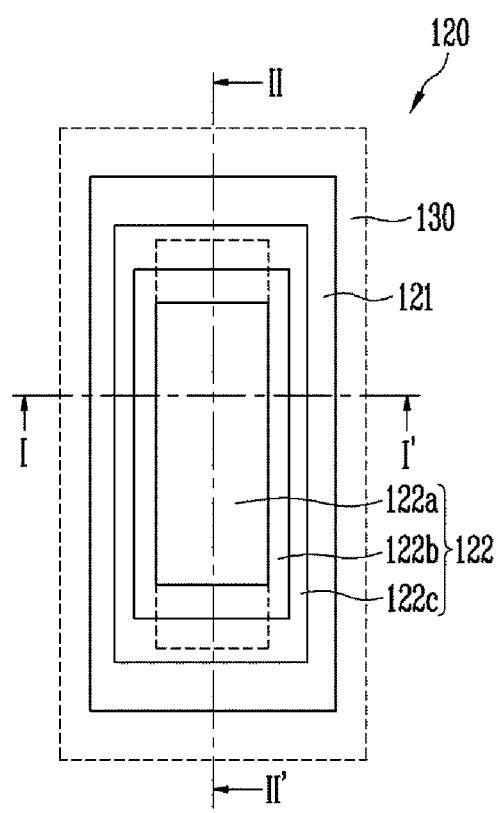
FIG. 3 is a plan view of a single connection terminal of a semiconductor chip constructed according to the principles of the invention
Figure 4A:
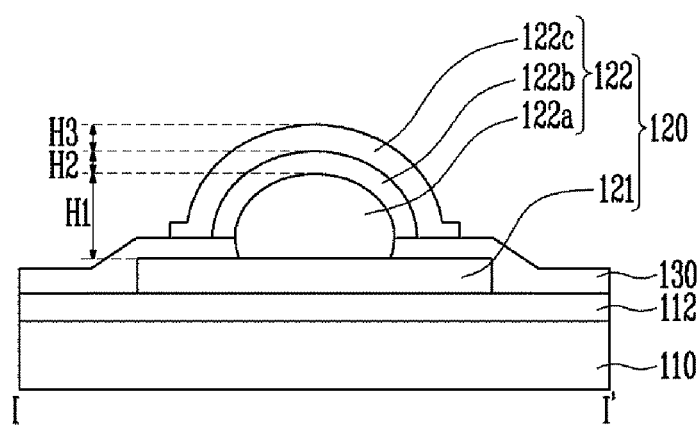
FIG. 4A is a cross-sectional view of the connection terminal of FIG. 3 taken along sectional line I-I' of FIG. 3 according to an exemplary embodiment.
Figure 4B:
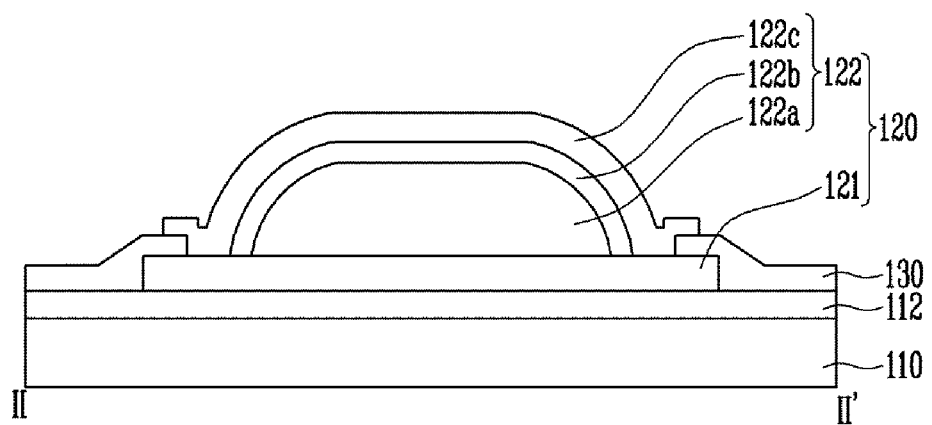
FIG. 4B is a cross-sectional view of the connection terminal of FIG. 3 taken along sectional line II-II' of FIG. 3 according to an exemplary embodiment.

FIG. 3 is a plan view of a single connection terminal of a semiconductor chip constructed according to the principles of the invention. FIG. 4A is a cross-sectional view of the connection terminal of FIG. 3 taken along sectional line I-I' of FIG. 3, and FIG. 4B is a cross-sectional view of the connection terminal of FIG. 3 taken along sectional line II-II of FIG. 3 according to an exemplary embodiment. For convenience of description, FIGS. 3, 4A and 4B illustrate only one embodiment of a connection terminal, but at least some of the connection terminals illustrated in FIGS. 1 and 2 may have the structures, which are similar to or substantially the same as each other. Further, FIG. 3 illustrates that both the conductive pad and bump configuring the connection terminal have quadrangular shapes, but the inventive concepts are not limited thereto. That is, shapes of a conductive pad and/or a bump may be variously changed. Additionally, in FIG. 3, an insulating layer is also shown for clearly illustrating the locational relationship between the respective elements configuring the connection terminal, and a boundary of the insulating layer is illustrated with a dotted line.

Referring to FIGS. 3, 4A and 4B, each connection terminal 120 includes a conductive pad 121 disposed on the substrate 110, and a bump 122 electrically connected to the conductive pad 121. The conductive pad 121 may form a body part of the semiconductor chip 100 together with the substrate 110. For example, the conductive pad 121 may be formed on at least one surface of the substrate 110 together with a circuit layer (not illustrated) to form a body part of the semiconductor chip 100 together with the circuit layer.

The bump 122 may be electrically connected to the conductive pad 121 through one region of the conductive pad 121, which is not covered by the insulating layer 130. The conductive pad 121 and the bump 122 may overlap each other. For example, the bump 122 may be disposed on one surface (for example, an upper surface) of the conductive pad 121 so as to overlap the conductive pad 121. An area of the region, in which the conductive pad 121 is provided, may be larger than an area of the region, in which the bump 122 is provided, but the inventive concepts are not limited thereto. The conductive pad 121 may be covered by the bump 122 and/or the insulating layer 130, and thus, may not be exposed to the outside.

One or more buffer layers 112 may be provided between the substrate 110 and the conductive pad 121. The buffer layer 112 may include one or more layers of an oxide layer or a nitride layer, but the inventive concepts are not limited thereto. For example, the buffer layer 112 may be formed of a silicon oxide ($SiO_2$) layer.

The conductive pad 121 may include one or more conductive layers, for example, one or more metal layers. For example, the conductive pad 121 may be implemented in a single layer formed of a metal layer including titanium (Ti) or gold (Au), or multiple layers including first and second metal layers formed of different metals each other. However, the material of the conductive pad 121 is not limited to the aforementioned metal, and may be changed. For example, the conductive pad 121 may include at least one of a metal, an alloy thereof, conductive polymer, and a conductive metal oxide. The metal, which may form the conductive pad 121, may include cooper (Cu), silver (Ag), gold (Au), platinum (Pt), palladium (Pd), nickel (Ni), tin (Sn), aluminum (Al), cobalt (Co), rhodium (Rh), iridium (Ir), iron (Fe), ruthenium (Ru), osmium (Os), manganese (Mn), molybdenum (Mo), tungsten (W), niobium (Nb), tantalum (Ta), titanium (Ti), bismuth (Bi), antimony (Sb), and/or lead (Pb). The conductive polymer, which may form the conductive pad 121, may include a polythiophenes compound, a polypyrroles compound, a polyaniline compound, a polyacetylene compound, and a polyphenylenethers compound, and/ or a mixture thereof. For example, in a particular embodiment, a PEDOT/PSS compound among the polythiophenes compounds may be used to form the conductive pad 121. The conductive metal oxide, which may form the conductive pad 121, may include an Indium Tin Oxide (ITO), an Indium Zinc Oxide (IZO), an Antimony Zinc Oxide (AZO), an Indium Tin Zinc Oxide (ITZO), a Zinc Oxide (ZnO), and/or a Tin Oxide ($SnO_2$). Further, in addition to the aforementioned conductive materials, as long as a material is capable of providing conductivity, the material may be used as the material forming the conductive pad 121. Further, the structure of the conductive pad 121 is not particularly limited, and may be variously implemented in a single layer or multiple layers.

The size of the conductive pad 121, and/or a pitch between adjacent conductive pads (conductive pads included in adjacent connection terminals 120) 121 are not particularly limited. The structure of the bump 122 according to an exemplary embodiment may stabilize connections between the connection terminals 120 and connection pads of an electronic device for the connection terminals 120 having a micro size and/or a fine pitch. The conductive pad 121 may have a micro size and/or a fine pitch of, for example, 10 μm to 15 μm.

The insulating layer 130 may be provided on an upper surface of at least one region of the conductive pad 121. The insulating layer 130 may include an opening exposing at least one region (for example, a bonding region or a contact region) of the conductive pad 121. For example, the insulating layer 130 may be patterned to cover only a border region of the conductive pad 121 while exposing a center portion of the conductive pad 121. The insulating layer 130 may be provided so as to cover a border of an upper surface of the conductive pad 121 while following a profile of a surface of the substrate 110 and the conductive pad 121. The insulating layer 130 may be provided as a passivation layer protecting the semiconductor chip 100.

The insulating layer 130 may include one or more layers of an oxide layer or a nitride layer, but is not limited thereto. For example, the insulating layer 130 may be formed of a silicon nitride SiNx layer.

The bump 122 may be positioned so as to be in contact with the conductive pad 121 on the exposed region (that is, the bonding region or the contact region) of the conductive pad 121. For example, the bump 122 may be on the conductive pad 121 so as to be in direct contact with the conductive pad 121. However, the inventive concepts are not limited thereto. That is, the positional relationship, and connection structure, between the conductive pad 121 and the bump 122 corresponding to the conductive pad 121 may be variously changed.

The bump 122 may be positioned on the conductive pad 121 and have a shape of a dome or a hemisphere protruding in a direction (for example, an up direction in FIGS. 4A and 4B) opposite to the substrate 110. When the bump 122 protrudes in the dome or hemisphere shape, the adhesive force due to the elasticity of polymer layer 122b forming the bump 122 is increased, thereby providing a reliable connection structure. However, the inventive concepts are not limited thereto, and the shape of the bump 122 may also be changed to various shapes including shapes such as a cylinder or a polyprism.

The bump 122 may include a metal core 122a, the polymer layer 122b covering a surface of the metal core 122a, and a conductive coating layer 122c electrically connected to the conductive pad 121 while covering a surface of the polymer layer 122b. For example, in the bump 122, the metal core 122a and the polymer layer 122b may form a core structure having a heterogeneous multi-layer structure. That is, the bump 122 according to an exemplary embodiment may be implemented as a metal cored polymer bump.

The metal core 122a, the polymer layer 122b, and the conductive coating layer 122c may be positioned so as to overlap one another, and the areas, in which the metal core 122a, the polymer layer 122b, and the conductive coating layer 122c are provided, may be sequentially increased. For example, the polymer layer 122b may be provided to cover a protruding surface of the metal core 122a while having a larger area than that of the metal core 122a, and the conductive coating layer 122c may be provided to cover a protruding surface of the polymer layer 122b while having a larger area than that of the polymer layer 122b. For example, the polymer layer 122b may be formed to completely cover an entire exposed surface of the metal core 122a, and the conductive coating layer 122c may be formed to completely cover an entire exposed surface of the polymer layer 122b. When the polymer layer 122b completely covers the surface of the metal core 122a, the bump 122 may generally have uniform elasticity. Further, when the conductive coating layer 122c completely covers surface of the polymer layer 122b, conductivity of the bump 122 may be stably secured.

The conductive coating layer 122c may be in contact with the conductive pad 121 while covering an exposed region in an upper surface of the conductive pad 121 (for example, a region, which is not covered by the polymer layer 122b in an opening region defined by an inner boundary line of the insulating layer 130 in FIGS. 3 and 4B) which is not covered by the metal core 122a, the polymer layer 122b, and the insulating layer 130 so that the conductive coating layer 122c may be electrically connected to the conductive pad 121. However, the inventive concepts are not limited thereto, and a connection structure between the conductive pad 121 and the bump 122 may be changed.

The metal core 122a may have a height H1 (or a thickness) of 5 μm to 6 μm. For example, the metal core 122a may be formed to have a height H1 of 5 μm to 6 μm based on one surface (one surface contacting the metal core 122a) of the conductive pad 121. However, the height H1 of the metal core 122a is not limited thereto, and the height H1 and the forming area of the metal core 122a may be changed according to sizes and/or pitches of the conductive pad 121 and/or the bump 122. Further, the height H1 of the metal core 122a may be changed according to the degree of elasticity required by the bump 122. For example, the height H1 of the metal core 122a may be set to correspond to a height H2 of the polymer layer 122b set according to a range of elasticity required by the bump 122 and an entire height (H1+H2+H3) of the bump 122. That is, the height H1 of the metal core 122a may be determined in comprehensively considering the entire height (H1+H2+H3) set in consideration of the pitch and the like of the conductive pad 121 and/or the bump 122, and the set thickness H2 of the polymer layer 122b.

The metal core 122a may be formed of one or more conductive layers formed of at least one of gold (Au), tin (Sn), nickel (Ni), titanium (Ti), and an alloy thereof. However, the inventive concepts are not limited thereto, and the conductive material forming the metal core 122a may be changed. For example, the metal core 122a may include at least a material, or an alloy including the material, selected from the group consisting of cooper (Cu), silver (Ag), gold (Au), platinum (Pt), palladium (Pd), nickel (Ni), tin (Sn), aluminum (Al), cobalt (Co), rhodium (Rh), iridium (Ir), iron (Fe), ruthenium (Ru), osmium (Os), manganese (Mn), molybdenum (Mo), tungsten (W), niobium (Nb), tantalum (Ta), titanium (Ti), bismuth (Bi), antimony (Sb), and lead (Pb).

The polymer layer 122b may be formed to cover a surface of the metal core 122a while having a larger area than that of the metal core 122a. For example, the polymer layer 122b may be coated on the surface of the metal core 122a so as to completely cover a surface including an upper surface and a lateral surface of the metal core 122a.

When it is assumed that the entire height (H1+H2+H3) of the bump 122 is set with 8 μm to 15 μm in considering a pitch condition and the like, the polymer layer 122b may be thinly coated on the surface of the metal core 122a so as to have the thickness H2 (or the height) of 1 μm to 3 μm. However, the thickness H2 of the polymer layer 122b is not limited thereto, and the thickness H2 of the polymer layer 122b may be varied according to an elastic range required by the bump 122 and/or a material of the polymer layer 122b.

When the thickness H2 of the polymer layer 122b is excessively small, for example, 1 μm or less, it may be difficult to obtain elasticity having the degree required for providing a stable connection structure according to an environment change or an impact applied from the outside. Further, when the thickness H2 of the polymer layer 122b is excessively large, for example, 7 μm or more, a crack or tear may be incurred by a load (for example, a load of 10 MPa or more) applied during a compression process with a connection pad of an electronic device. That is, according to an exemplary embodiment, the thickness H2 of the polymer layer 122b may be set within a range of 1 μm to 7 μm so as to prevent the crack or the tear while providing elasticity of a predetermined range.

According to an exemplary embodiment, the core structure of the bump 122 is formed in a structure of at least two layers including the metal core 122a and the polymer layer 122b. Accordingly, the bump 122 may be formed to limit the elasticity of the polymer 122b to the range, in which elastic enough to compliantly react to an environment change or external pressure and to stabilize the connection structure is secured, and the crack or the tear may be prevented during the compression process. For example, the bump 122 corresponding to the connection terminal 120 of the desired size and/or pitch may be formed, and the compliant bump 122, in which the connection structure is stabilized within the range, in which the crack and the tear of the polymer layer 122b is prevented may be formed by adjusting the heights (or the thicknesses) H1 and H2, the sizes, and/or the materials of the metal core 122a and the polymer layer 122b.

The polymer layer 122b may be formed of polymer having elasticity, and a material of the polymer layer 122b is not particularly limited. The polymer layer 122b may be formed of a conductive polymer, which is capable of providing conductivity required for transmitting various signals and/or power between the conductive pad 121 of the semiconductor chip 100 and the electronic device connected to the semiconductor chip 100. For example, the polymer layer 122b may be formed of a polymer material of an epoxy resin. Further, the polymer layer 122b may be formed of a single layer or a multiple layer, but a structure of the polymer layer 122b is not particularly limited.

The polymer layer 122b may form a core structure of the bump 122 together with the metal core 122a, and a height (H1+H2) (or a thickness) of the core structure may be 6 μm to 9 μm. However, the inventive concepts are not limited thereto, the height (H1+H2) of the core structure may be set with a range, in which the core structure may be stably connected to the connection pad of the electronic device connected to the semiconductor chip 100 and may provide a compliant characteristic. Further, the height (H1+H2) of the core structure may be variously changed according to the size of the connection terminal 120 and/or the pitch between the adjacent connection terminals 120.

The conductive coating layer 122c may be formed to have a larger area than that of the polymer layer 122b and may completely cover a surface of the polymer layer 122b. For example, the conductive coating layer 122c may be in contact with the conductive pad 121 while covering the exposed region, which is not covered by the metal core 122a, the polymer layer 122b, and the insulating layer 130, in an upper surface of the conductive pad 121 together with the polymer layer 122b to be electrically connected to the conductive pad 121. For example, the conductive coating layer 122c may be in contact with the conductive pad 121 in a region surrounding and adjacent to an inner boundary of the insulating layer 130. However, the inventive concepts are not limited thereto, and a connection structure between the conductive pad 121 and the conductive coating layer 122c may be changed.

The conductive coating layer 122c may have a thickness H3 (or a height) of 2 μm to 6 μm, but is not limited thereto. For example, the thickness H3 of the conductive coating layer 122c may be determined within the range of the height (H1+H2+H3) of the bump 122 set to correspond to the size of the connection terminal 120 and/or the pitch between the adjacent connection terminals 120 while securing conductivity required for the bump 122 by stably covering, by the conductive coating layer 122c, the surface of the non-conductive polymer layer 122b. For example, when the size of the connection terminal 120 and/or the pitch between the adjacent connection terminals 120 is fine, which is 10 μm to 15 μm, the entire height (H1+H2+H3) of the bump 122 may be set with 8 μm to 15 μm. However, the height (H1+H2+H3) of the bump 122 is not limited thereto, and may be changed according to a design condition of the semiconductor chip 100.

The conductive coating layer 122c may be formed of one or more conductive layers coated on a surface of the polymer layer 122b. For example, the conductive coating layer 122c may be formed of one or more metal layers including at least a material, or an alloy including the material, selected from the group consisting of cooper (Cu), silver (Ag), gold (Au), platinum (Pt), palladium (Pd), nickel (Ni), tin (Sn), aluminum (Al), cobalt (Co), rhodium (Rh), iridium (Ir), iron (Fe), ruthenium (Ru), osmium (Os), manganese (Mn), molybdenum (Mo), tungsten (W), niobium (Nb), tantalum (Ta), titanium (Ti), bismuth (Bi), antimony (Sb), and lead (Pb), but is not limited thereto. Further, in addition to the aforementioned conductive materials, as long as a material is capable of providing conductivity, the material may be used as the material forming the conductive coating layer 122c. The conductive coating layer 122c is formed of a conductive material, which is capable of providing conductivity required for transmitting various signals and/or power to the connection pad of the electronic device connected to the semiconductor chip 100.

According to an exemplary embodiment, the semiconductor chip 100 including the bump 122 is provided with a metal cored polymer structure. A semiconductor chip 100 having a highly reliable connection structure and an electronic device (for example, a display device) including the semiconductor chip 100 may be provided.

More particularly, according to an exemplary embodiment, by the compliant characteristic of the polymer layer 122b, the semiconductor chip 100, which is capable of more compliantly reacting to various environment changes and external pressure than, e.g., a solid metal bump, may be provided. Accordingly, a stable connection structure between the semiconductor chip 100 and the electronic device connected to the semiconductor chip 100 may be obtained.

Further, according to an exemplary embodiment, the metal core 122a may be provided inside the polymer layer 122b, so that the thickness (H1+H2+H3) of the bump 122 required for an easy connection may be obtained, and the range of elasticity may easily be limited, compared to a structure in which the core is formed of only a polymer layer. That is, the thickness H2 of the polymer layer 122b may be decreased than that of a single core structure formed of only the polymer layer 122b. For example, the thickness H2 of the polymer layer 122b may be decreased to 7 μm or less, so that even though a predetermined range of load is applied to the bump 122 during a compression process (bonding process), a crack or tear of the polymer layer 122b may be prevented. Accordingly, defects occurring during the compression process may be decreased, and mass production may be facilitated and optimized.

In addition, according to an exemplary embodiment, the polymer bump 122 having conductivity due to being coated with the conductive coating layer 122c may be fixed to the semiconductor chip 100. For example, a plurality of conductive polymer bumps 122 may be formed on one surface (for example, one surface of the conductive pad 121) of the semiconductor chip 100 according to an exemplary embodiment. Accordingly, when the semiconductor chip 100 is mounted in the electronic device, it is not necessary to use an ACF having conductive particles. Accordingly, a short-circuit defect or an open failure by the non-uniformly distributed conductive particles of the ACF may be prevented, and the connection structure between the semiconductor chip 100 and the electronic device may be stabilized.

Figure 5A:
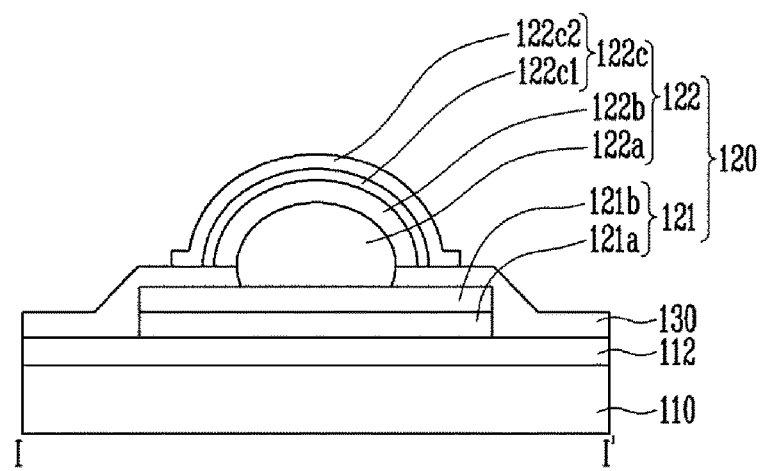
FIG. 5A is a cross-sectional view of the connection terminal of FIG. 3 taken along sectional line I-I' of FIG. 3 according to another exemplary embodiment.
Figure 5B:
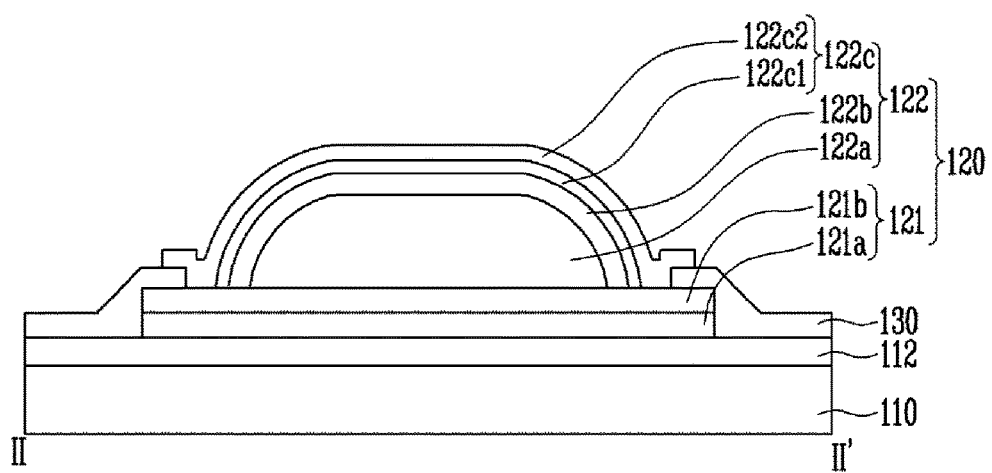
FIG. 5B is a cross-sectional view of the connection terminal of FIG. 3 taken along sectional line II-II of FIG. 3 according to another exemplary embodiment.

FIG. 5A is a cross-sectional view of the connection terminal of FIG. 3 taken along sectional line I-I' of FIG. 3 according to another exemplary embodiment. FIG. 5B is a cross-sectional view of the connection terminal of FIG. 3 taken along sectional line II-IF of FIG. 3 according to another exemplary embodiment. In FIGS. 5A and 5B, the similar to identical constituent element as that of the embodiment illustrated in FIGS. 3, 4A, and 4B is denoted with the same reference numeral, and a detailed description thereof will be omitted.

Referring to FIGS. 5A and 5B, at least one of the conductive pad 121 and the conductive coating layer 122c may be formed of two or more layers. For example, considering a resistance value or an interface characteristic of the conductive pad 121 and/or the conductive coating layer 122c, at least one of the conductive pad 121 and the conductive coating layer 122c may be formed in a lamination structure including two or more conductive layers.

The conductive pad 121 may be formed in a lamination structure including a first conductive layer 121a and a second conductive layer 121b, of which at least one region overlaps. For descriptive convenience, FIGS. 5A and 5B illustrate that the first conductive layer 121a and the second conductive layer 121b have the same area and completely overlap each other, but the inventive concepts are not limited thereto. That is, the sizes (the areas, the thicknesses, and the like) of the first conductive layer 121a and the second conductive layer 121b, and a disposition structure of the first conductive layer 121a and the second conductive layer 121b may be variously changed.

The conductive coating layer 122c may be formed in a lamination structure including a third conductive layer 122c1 and a fourth conductive layer 122c2, of which at least one region overlaps. For example, conductivity of the bump 122 may be stably secured by coating the surface of the polymer layer 122b twice using a conductive material.

Figure 6:
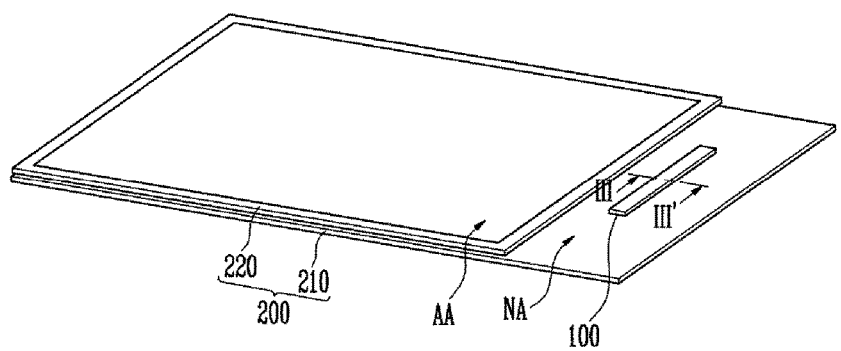
FIG. 6 is a perspective view of an electronic device constructed according to the principles of the invention.
Figure 7:
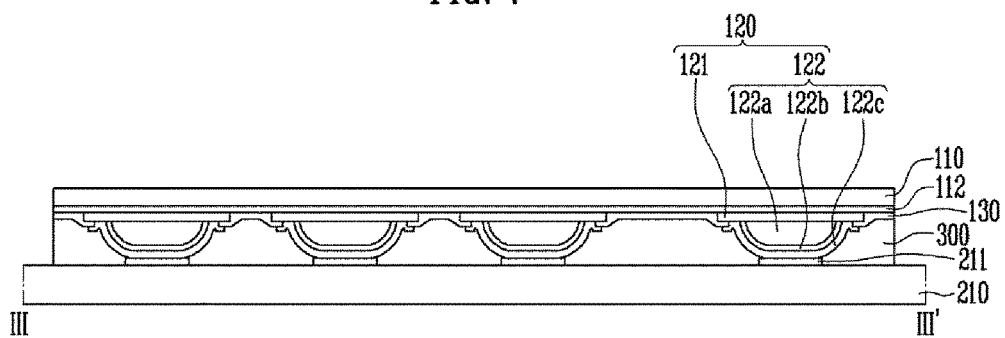
FIG. 7 is a cross-sectional view of the electronic device of FIG. 6 taken along sectional line III-III" of FIG. 6.

FIG. 6 is a perspective view of an electronic device constructed according to the principles of the invention. FIG. 7 is a cross-sectional view of the electronic device of FIG. 6 taken along sectional line III-III" of FIG. 6. According to exemplary embodiment, FIGS. 6 and 7 illustrate a display device as an example of the electronic device, but the inventive concepts are not limited to display devices. In FIGS. 6 and 7, components similar to those described in the embodiments of FIGS. 1 to 5 are denoted with like reference numerals, and detailed descriptions thereof are not necessary and have been omitted for clarity.

Referring to FIGS. 6 and 7, the electronic device, for example, the display device, includes a display panel 200 and a semiconductor chip 100 mounted on the display panel 200.

The display panel 200 may include a first substrate 210 and a second substrate 220, which overlap each other in at least an active area AA, and a plurality of connection pads 211 disposed in a non-active area NA of the first substrate 210. The active area AA is an area, in which at least pixels (not illustrated) are provided, and may mean an area, in which an image is displayed. The non-active area NA means the remaining area except for the active area AA, and may include, for example, a wire routing area, a pad area, and/or various dummy areas. The display panel 200 may be one of an organic light emitting display panel, a liquid crystal display panel, and a plasma display panel, but the kind of display panel 200 is not limited thereto.

At least one of the first substrate 210 and the second substrate 220 may include a glass substrate or a plastic substrate, but is not limited thereto. For example, the first substrate 210 and/or the second substrate 220 may be a flexible substrate including at least one of polyethersulfone (PES), polyacrylate, polyetherimide (PEI), polyethylene naphthalate (PEN), polyethylene terephthalate (PET), polyphenylene sulfide (PPS), polyarylate (PAR), polyimide (PI), polycarbonate (PC), cellulous tri acetate (TAC), and cellulose acetate propionate (CAP). Further, the first substrate 210 and/or the second substrate 220 may also include a rigid substrate including glass or tempered glass. The first substrate 210 and/or the second substrate 220 may include a substrate formed of a transparent material, but is not limited thereto. For example, the first substrate 210 and/or the second substrate 220 may be an opaque and/or reflective substrate.

At least one of the first substrate 210 and the second substrate 220 may include an insulating layer including at least one layer of an inorganic layer and/or an organic layer. For example, the second substrate 220 may be a thin film encapsulation (TFE) layer including at least one layer of an inorganic layer and/or an organic layer.

The connection pads 211 may be formed of a conductive material and may be connected to various signal lines and/or power lines (not illustrated). The connection pads 211 may transmit various power sources and/or signals for driving the display panel 200 between the display panel 200 and the semiconductor chip 100.

The semiconductor chip 100 may be mounted in the non-active area NA on the first substrate 210. The semiconductor chip 100 may be the semiconductor chip 100 according to one of the embodiments of FIGS. 1 to 5B. That is, the semiconductor chip 100 may include a body part including the substrate 110 and at least one conductive pad 121, and at least one bump 122 electrically connected to the conductive pad 121. The corresponding conductive pad 121 and bump 122 may form a connection terminal 120.

The semiconductor chip 100 may include a driving circuit for driving the display panel 200. For example, a scan driving circuit and/or a data driving circuit, which are not illustrated, may be integrated inside the semiconductor chip 100, for example, on a circuit layer of the semiconductor chip 100.

One of the connection pads 211 of the display panel 200 and the conductive pad 121 of the semiconductor chip 100 may be electrically connected with each other by the bumps 122. For example, one of the connection pads 211 and the conductive pad 121 may be disposed so that each of the connection pads 211 and the conductive pad 121 make a pair and face each other, and each of the connection pads 211 and the conductive pad 121 facing each of the connection pads 211 may be electrically connected by the corresponding bump 122 disposed between each of the connection pads 211 and the conductive pad 121.

Each bump 122 may be a metal cored polymer bump having a compliant characteristic as described in the embodiments of FIGS. 3 to 5B. For example, each bump 122 may include a metal core 122a, the polymer layer 122b covering a surface of the metal core 122a, and a conductive coating film 122c electrically connected to corresponding connection pads 211 while covering a surface of the polymer layer 122b. That is, each bump 122 may be electrically connected between corresponding conductive pad 121 and corresponding one of the connection pads 211 to make a current flow between the conductive pad 121 and one of the connection pads 211.

A non-conductive adhesive layer 300, such as a Non-Conductive Film (NCF), may be provided between the display panel 200 and the semiconductor chip 100. The non-conductive adhesive layer 300 may be interposed between the display panel 200 and the semiconductor chip 100 to stably bond the semiconductor chip 100 onto the display panel 200.

Figure 8:
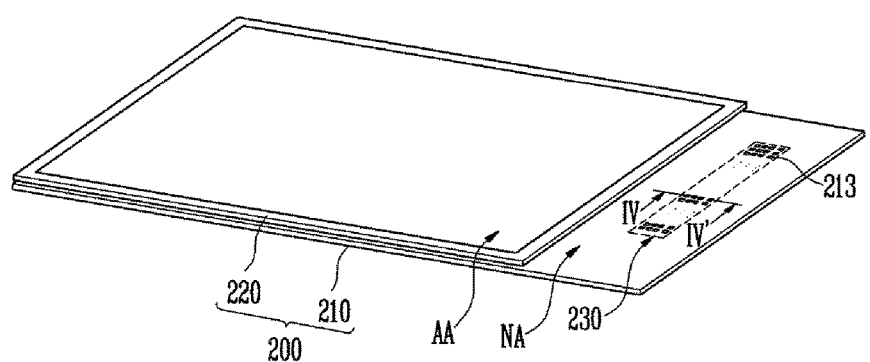
FIG. 8 is a perspective view of a display panel constructed according to the principles of the invention.
Figure 9:
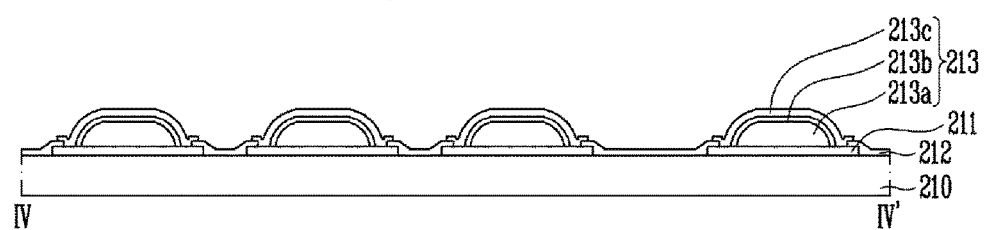
FIG. 9 is a cross-sectional view of the display panel of FIG. 8 taken along sectional line IV-IV" of FIG. 8.

FIG. 8 is a perspective view of a display panel constructed according to the principles of the invention. FIG. 9 is a cross-sectional view of the display panel of FIG. 8 taken along sectional line IV-IV' of FIG. 8. In FIGS. 8 and 9, components similar to those described in the embodiments of FIGS. 1 to 7 are denoted with like reference numerals, and detailed descriptions thereof are not necessary and have been omitted for clarity.

Referring to FIGS. 8 and 9, a bump structure, which is capable of improving a connection structure like the bump 122 described with reference to FIGS. 1 to 7, may also be applied to a pad part 230 of a display panel 200. However, in order to avoid confusion with the bump 122, the bump structure applied to the pad part 230 will be called a protruding pad 213.

According to an exemplary embodiment, the display panel 200 includes a first substrate 210 and a second substrate 220, which overlap each other in at least an active area AA, and a pad part 230 disposed in a predetermined area, for example, a non-active area NA, of the first substrate 210.

At least one of the first substrate 210 and the second substrate 220 may include a glass substrate or a plastic substrate, but is not limited thereto. Further, at least one of the first substrate 210 and the second substrate 220 may include a rigid substrate or a flexible substrate. Further, at least one of the first substrate 210 and the second substrate 220 may include a thin film encapsulation layer including at least one layer of an inorganic layer and/or an organic layer.

According to an exemplary embodiment, the pad part 230 includes a protruding pad 213 for a stable connection with an external circuit device, such as the semiconductor chip 100, and connection pads 211 electrically connected to the protruding pad 213, respectively.

The protruding pad 213 may be positioned on one surface of the corresponding connection pads 211. For example, the protruding pad 213 may be positioned so as to be in direct contact with an exposed surface of the connection pads 211, which is not covered by a passivation layer 212. The passivation layer 212 may entirely cover one surface of the non-active area NA of the first substrate 210, and may have an opening exposing predetermined regions of the connection pads 211.

The protruding pad 213 may have a structure, which is the substantially the same as or similar to a structure of the bump 122 described with reference to FIGS. 1 to 7. For example, the protruding pad 213 may include a metal core 213a disposed on one surface of the corresponding connection pads 211, a polymer layer 213b covering a surface of the metal core 213a, and a conductive coating layer 213c covering a surface of the polymer layer 213b.

The protruding pad 213 may be disposed on one surface of the corresponding connection pads 211 and protrude in a direction (for example, an up direction) opposite to the first substrate 210, and the polymer layer 213b may cover a protruding surface of the metal core 213a. For example, the polymer layer 213b may completely cover an entire exposed surface of the metal core 213a. The polymer layer 213b may have a thickness of 1 μm to 7 μm so as to provide elasticity in a degree, in which the connection structure may be stabilized, and prevent a crack or tear of the polymer layer 213b during a compression process.

The conductive coating layer 213c may cover a protruding surface of the polymer layer 213b. For example, the conductive coating layer 213c may cover an entire exposed surface of the polymer layer 213b.

The display panel 200 according to the aforementioned embodiment may include the protruding pad 213, thereby providing a highly reliable connection structure when an external circuit device is connected.

Figure 10:
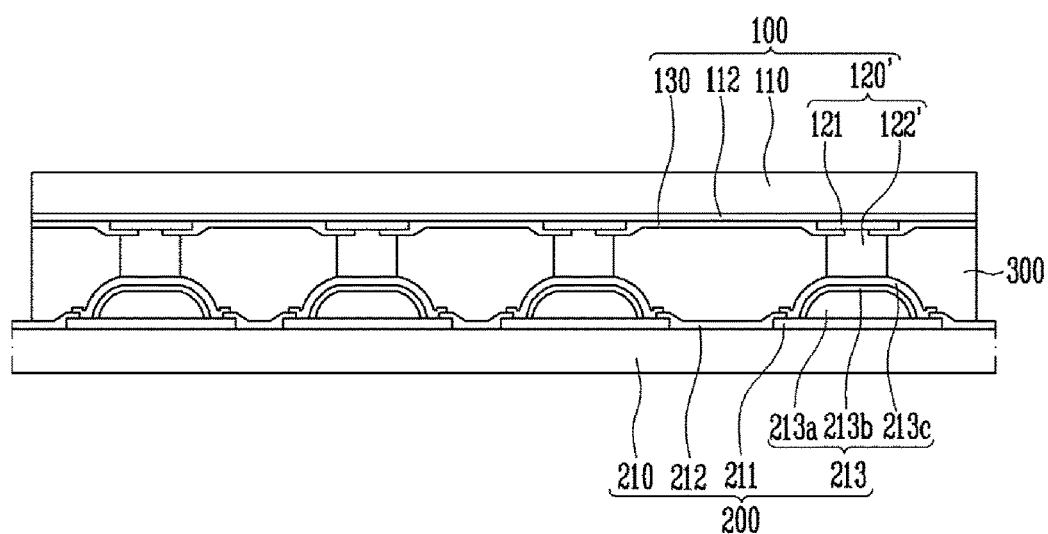
FIG. 10 is a cross-sectional view of an electronic device constructed according to the principles of the invention.

FIG. 10 is a cross-sectional view of an electronic device constructed according to the principles of the invention. In FIG. 10, components similar to those described in the embodiments in FIGS. 1 to 9 are denoted with like reference numerals, and detailed descriptions thereof are not necessary and have been omitted for clarity.

Referring to FIG. 10, the electronic device according to another exemplary embodiment, for example, a display device, includes a semiconductor chip 100 and a display panel 200 which are electrically connected with each other. A non-conductive adhesive layer 300 may be provided in at least one area between the semiconductor chip 100 and the display panel 200.

The display panel 200 may be a display panel described with reference to FIGS. 8 and 9. That is, the display panel 200 may be a display panel including a protruding pad 213 including a metal core 213a, a polymer layer 213b, and a conductive coating layer 213c, and connection pads 211 electrically connected to the protruding pad 213.

The semiconductor chip 100 may include connection terminals 120' connected to the protruding pad 213 of the display panel 200, respectively. Each of the connection terminals 120' may include a conductive pad 121 and a bump 122' electrically connected to the conductive pad 121.

The bump 122' may include a metal bump electrically connected to the conductive pad 121. However, the bump 122' is not limited to the metal bump. For example, the semiconductor chip 100 may also be a semiconductor chip including the bump 122 described with reference to FIGS. 1 to 7.

Any one of the semiconductor chip 100 and the display panel 200, or both the semiconductor chip 100 and the display panel 200 may include a metal cored polymer bump structure (the bump 122 or the protruding pad 213). According to another exemplary embodiment, a reliable connection structure between the semiconductor chip 100 and the display panel 200 may be provided.

Although certain exemplary embodiments and implementations have been described herein, other embodiments and modifications will be apparent from this description. Accordingly, the inventive concepts are not limited to such embodiments, but rather to the broader scope of the presented claims and various obvious modifications and equivalent arrangements.

What is claimed is:

1. A semiconductor chip, comprising:
   a substrate;
   one or more conductive pads disposed on the substrate; and
   one or more bumps electrically connected to the one or more conductive pads,
   wherein the one or more bumps comprise a metal core, a polymer layer disposed over side and upper surfaces of the metal core, and a conductive coating layer disposed over side and upper surfaces of the polymer layer and electrically connected to the one or more conductive pads.

2. The semiconductor chip of claim 1, wherein the polymer layer has a thickness of 1 μm to 7 μm.

3. The semiconductor chip of claim 1, wherein the polymer layer is directly adjacent to and covers the side and upper surfaces of the metal core.

4. The semiconductor chip of claim 3, wherein the side and upper surfaces of the metal core form a convex surface, and the polymer layer covers the convex surface of the metal core.

5. The semiconductor chip of claim 1, wherein the conductive coating layer is directly adjacent to and covers the side and upper surfaces of the polymer layer.

6. The semiconductor chip of claim 5, wherein the side and upper surfaces of the polymer layer form a convex surface, and the conductive coating layer covers the convex surface of the polymer layer.

7. The semiconductor chip of claim 1, wherein the conductive coating layer comprises one or more metal layers.

8. The semiconductor chip of claim 1, further comprising:
   an insulating layer disposed over the one or more conductive pads, and exposing at least one area of the one or more conductive pads.

9. The semiconductor chip of claim 8, wherein the one or more bumps contact the at least one exposed area.

10. The semiconductor chip of claim 1, wherein the one or more bumps are disposed on the one or more conductive pads, and have a convex shape selected from the group consisting of a dome shape and a hemisphere shape, with the convex shape extending in a direction away from the substrate.

11. A display panel, comprising:
    a substrate;
    a plurality of connection pads disposed in a first area of the substrate; and
    a plurality of protruding pads electrically connected to the plurality of connection pads, respectively,
    wherein at least some of the plurality of protruding pads comprise a metal core, a polymer layer covering side and upper surfaces of the metal core, and a conductive coating layer covering side and upper surfaces of the polymer layer.

12. The display panel of claim 11, wherein at least some of the metal cores have side and upper surfaces that form a convex surface extending away from the substrate and are disposed on one surface of one of the plurality of connection pads, and wherein the polymer layer covers the convex surface of the at least some metal cores.

13. The display panel of claim 12, wherein the side and upper surfaces of the polymer layer form a convex surface, and the conductive coating layer covers the convex surface of the polymer layer.

14. The display panel of claim 11, wherein the polymer layer has a thickness of 1 μm to 7 μm.

15. An electronic device, comprising:
    a substrate comprising a plurality of connection pads;
    a semiconductor chip mounted on the substrate and having a plurality of conductive pads, the plurality of conductive pads facing the plurality of connection pads, respectively; and
    a plurality of bump structures disposed between the plurality of connection pads and the plurality of conductive pads, and the plurality of bump structures electrically connecting the plurality of connection pads to the plurality of conductive pads,
    wherein at least some of the plurality of bump structures comprise a metal core, a polymer layer covering side and upper surfaces of the metal core, and a conductive coating layer covering side and upper surfaces of the polymer layer.

16. The electronic device of claim 15, wherein the polymer layer has a thickness of 1 μm to 7 μm.

17. The electronic device of claim 15, wherein the side and upper surfaces of the metal core form a convex surface, and the polymer layer covers the convex surface of the metal core.

18. The electronic device of claim 15, wherein the side and upper surfaces of the polymer layer form a convex surface, and the conductive coating layer covers the convex surface of the polymer layer.

19. The electronic device of claim 15, further comprising a non-conductive adhesive layer disposed between the substrate and the semiconductor chip.

20. The electronic device of claim 15, further comprising a display panel comprising the substrate.

* * * * *